(12) United States Patent
Song et al.

(10) Patent No.: US 12,557,499 B2
(45) Date of Patent: Feb. 17, 2026

(54) DISPLAY APPARATUS AND METHOD OF MANUFACTURING THE SAME

(71) Applicant: SAMSUNG DISPLAY CO., LTD., Yongin-si (KR)

(72) Inventors: Hyunseop Song, Yongin-si (KR); Youngjoo Nam, Yongin-si (KR); Jooyoung Kim, Yongin-si (KR); Youngjin Park, Yongin-si (KR); Byungchul Shin, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 453 days.

(21) Appl. No.: 18/109,359

(22) Filed: Feb. 14, 2023

(65) Prior Publication Data
US 2023/0269979 A1 Aug. 24, 2023

(30) Foreign Application Priority Data
Feb. 18, 2022 (KR) .................... 10-2022-0021725

(51) Int. Cl.
*H10K 59/131* (2023.01)
*H05K 1/189* (2026.01)
*H10K 59/12* (2023.01)
*H10K 59/80* (2023.01)

(52) U.S. Cl.
CPC .......... *H10K 59/131* (2023.02); *H05K 1/189* (2013.01); *H10K 59/1201* (2023.02); *H10K 59/873* (2023.02); *H05K 2201/10128* (2013.01)

(58) Field of Classification Search
CPC .................................................. H10K 59/131
See application file for complete search history.

(56) References Cited

U.S. PATENT DOCUMENTS

| | | | |
|---|---|---|---|
| 9,082,998 B2 | 7/2015 | Lee | |
| 9,658,659 B2 | 5/2017 | Yun et al. | |
| 9,807,834 B2 | 10/2017 | Rickers | |
| 2019/0102027 A1* | 4/2019 | Yoo | G06F 3/0445 |
| 2020/0033970 A1* | 1/2020 | Park | G06F 3/044 |

FOREIGN PATENT DOCUMENTS

| | | |
|---|---|---|
| CN | 105981480 | 10/2020 |
| KR | 10-0753867 | 9/2007 |
| KR | 10-2009-0105017 | 10/2009 |
| KR | 10-1306135 | 9/2013 |
| KR | 10-1844529 | 4/2018 |
| KR | 10-1970357 | 4/2019 |

* cited by examiner

*Primary Examiner* — Douglas M Menz
(74) *Attorney, Agent, or Firm* — F. CHAU & ASSOCIATES, LLC

(57) ABSTRACT

A display apparatus includes: a substrate; a display layer located on a first surface of the substrate; a cover panel located on a second surface, opposite to the first surface, of the substrate; a printed circuit board located on the cover panel; a plurality of first terminals located on a first side of the printed circuit board; a plurality of second terminals spaced apart from the plurality of first terminals; a cover portion covering the printed circuit board; and a connection pattern located on a surface of the cover portion and arranged within a perimeter of the printed circuit board, wherein the surface of the cover portion faces the printed circuit board.

20 Claims, 8 Drawing Sheets

DISPLAY APPARATUS AND METHOD OF MANUFACTURING THE SAME

CROSS-REFERENCE TO RELATED APPLICATION

This application claims priority under 35 U.S.C. § 119 to Korean Patent Application No. 10-2022-0021725, filed on Feb. 18, 2022, in the Korean Intellectual Property Office, the disclosure of which is incorporated by reference herein in its entirety.

TECHNICAL FIELD

One or more embodiments of the present invention relate to a display apparatus and a method of manufacturing the same, and more particularly, to a display apparatus connecting terminals to each other and a method of manufacturing the display apparatus.

DISCUSSION OF THE RELATED ART

Recently, electronic devices have been widely used. Electronic devices may include, for example, mobile electronic devices and fixed electronic devices, and many electronic devices include a display apparatus for providing visual information such as an image to a user to support various functions.

Generally, a display apparatus includes a substrate that is divided into a display area and a peripheral area. In the display area, a scan line and a data line insulated from each other are formed, and a plurality of pixels are also included in the display area. In addition, a thin-film transistor corresponding to each of pixels and a pixel electrode electrically connected to the thin-film transistor are provided in the display area. Additionally, a counter electrode commonly located over the pixels may be provided in the display area. Regarding the peripheral area, various wirings, a scan driving unit, a data driver, a controller, a pad unit, etc. for transmitting electrical signals to the display area may be provided in the peripheral area.

SUMMARY

According to an embodiment of the present invention, a display apparatus includes: a substrate; a display layer located on a first surface of the substrate; a cover panel located on a second surface, opposite to the first surface, of the substrate; a printed circuit board located on the cover panel; a plurality of first terminals located on a first side of the printed circuit board; a plurality of second terminals spaced apart from the plurality of first terminals; a cover portion covering the printed circuit board; and a connection pattern located on a surface of the cover portion and arranged within a perimeter of the printed circuit board, wherein the surface of the cover portion faces the printed circuit board.

In an embodiment of the present invention, the connection pattern connects the plurality of first terminals to the plurality of second terminals.

In an embodiment of the present invention, the connection pattern includes a plurality of linear patterns spaced apart from one another and parallel to one another, wherein each of the plurality of linear patterns connects a first-first terminal of the plurality of first terminals to a first-second terminal of the plurality of second terminals facing the first-first terminal.

In an embodiment of the present invention, a width of each of the plurality of linear patterns is large enough such that each of the plurality of linear patterns completely covers the first terminal and the second terminal.

In an embodiment of the present invention, a width of each of the plurality of linear patterns is less than each of an interval between the plurality of first terminals and an interval between the plurality of second terminals.

In an embodiment of the present invention, a length of each of the plurality of linear patterns is greater than a distance between the first-first terminal and the first-second terminal.

In an embodiment of the present invention, a thickness of portions of the connection pattern at a first-first terminal of the plurality of first terminals and at a first-second terminal of the plurality of second terminals is greater than a thickness of a portion of the connection pattern between the first-first terminal and the first-second terminal.

In an embodiment of the present invention, the cover portion includes an insulating material, and the connection pattern includes a conductive material.

In an embodiment of the present invention, the connection pattern is provided as a film including at least one of copper or aluminum.

In an embodiment of the present invention, an adhesive layer is located between the cover portion and the connection pattern.

According to an embodiment of the present invention, a method of manufacturing a display apparatus includes: bending a flexible circuit board connected to a substrate to face a rear surface of the substrate; providing a printed circuit board on a cover panel that is located on the rear surface of the substrate, wherein the printed circuit board is connected to the flexible circuit board; forming a connection pattern on a cover portion, wherein the connection pattern connects a plurality of terminals spaced apart from one another on the printed circuit board to each other when the cover portion is attached to the printed circuit board; and providing the cover portion on the printed circuit board.

In an embodiment of the present invention, the connection pattern connects a plurality of first terminals of the plurality of terminals located on a first side of the printed circuit board to a plurality of second terminals of the plurality of terminals, wherein the plurality of second terminals is spaced apart from the plurality of first terminals.

In an embodiment of the present invention, the connection pattern includes a plurality of linear patterns that are spaced apart from one another and are parallel to one another.

In an embodiment of the present invention, the forming of the connection pattern on the cover portion includes forming the connection pattern so that a width of each of the plurality of linear patterns is less than each of an interval between the plurality of first terminals and an interval between the plurality of second terminals.

In an embodiment of the present invention, the forming of the connection pattern on the cover portion includes forming the connection pattern so that a length of each of the plurality of linear patterns is greater than a distance between a first terminal of the plurality of first terminals and a second terminal of the plurality of second terminals.

In an embodiment of the present invention, the forming of the connection pattern on the cover portion includes forming the connection pattern so that a thickness of portions of the connection pattern at a first terminal of the plurality of first terminals and at a second terminal of the plurality of first terminals is greater than a thickness of a portion of the connection pattern between the first terminal and the second terminal.

In an embodiment of the present invention, the forming of the connection pattern on the cover portion includes adhering the connection pattern to a surface of the cover portion facing the printed circuit board.

In an embodiment of the present invention, the cover portion includes an insulating material, and the connection pattern includes a conductive material.

In an embodiment of the present invention, the connection pattern is provided as a film including at least one of copper or aluminum.

In an embodiment of the present invention, the providing of the cover portion on the printed circuit board includes forming an adhesive layer on a surface of the cover portion facing the printed circuit board and adhering the cover portion to the printed circuit board.

BRIEF DESCRIPTION OF THE DRAWINGS

The above and other features of the present invention will be more apparent by describing in detail embodiments thereof, with reference to the accompanying drawings, in which.

DETAILED DESCRIPTION OF THE EMBODIMENTS

Figure 1:
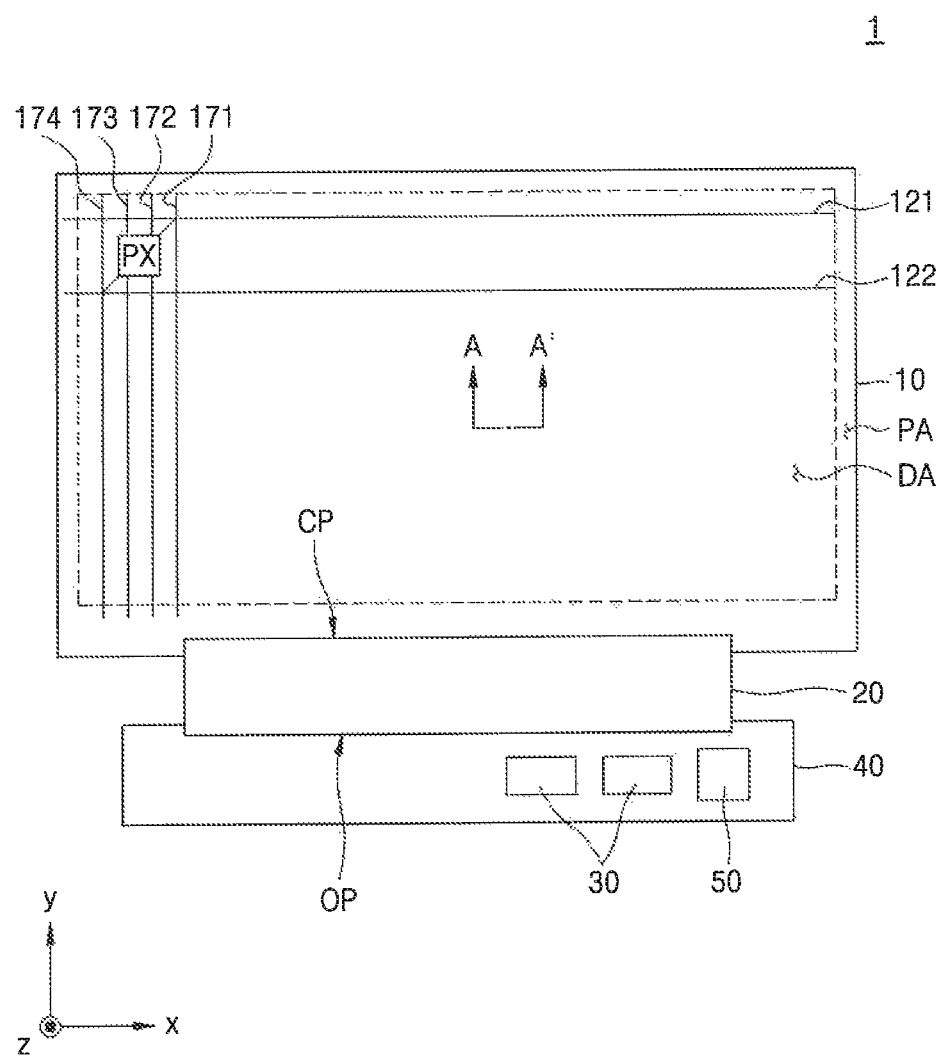
FIG. 1 is a plan view schematically illustrating a display apparatus, according to an embodiment of the present invention.

Exemplary embodiments of the present invention will now be described more fully with reference to the accompanying drawings. It is to be understood that the present invention may be embodied in different forms and thus should not be construed as being limited to the exemplary embodiments set forth herein. It is to be understood that like reference numerals may refer to like elements throughout the specification, and thus redundant descriptions may be omitted. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Although the terms "first," "second," etc. may be used to describe various elements, these elements should not be limited by these terms. These terms are only used to distinguish one element from another. Thus, a first component discussed below could be termed a second component without departing from the spirit and scope of the present invention.

As used herein, the singular forms "a," "an," and "the" are intended to include the plural forms as well, unless the context clearly indicates otherwise.

It will be further understood that, when a layer, region, or component is referred to as being "on" another layer, region, or component, it may be directly on the other layer, region, or component, or may be indirectly on the other layer, region, or component with intervening layers, regions, or components therebetween.

In the drawings, various thicknesses, lengths, and angles are shown and while the arrangement shown does indeed represent an embodiment of the present invention, it is to be understood that modifications of the various thicknesses, lengths, and angles may be possible within the spirit and scope of the present invention and the present invention is not necessarily limited to the particular thicknesses, lengths, and angles shown.

In an embodiment of the present invention, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment of the present invention may be implemented differently, a specific process order may be different from the described order. For example, two consecutively described processes may be performed at substantially the same time or may be performed in an order opposite to the described order.

Examples of a display apparatus for displaying an image may include an organic light-emitting display apparatus, an inorganic light emitting display apparatus, and a quantum dot light-emitting display apparatus.

Although an organic light-emitting display apparatus is used as a display apparatus according to an embodiment of the present invention, the disclosure is not limited thereto and any of various display apparatuses may be used.

FIG. 1 is a plan view schematically illustrating a display apparatus, according to an embodiment of the present invention.

As shown in FIG. 1, a display apparatus 1 may include a display panel 10, a flexible circuit board 20, and a printed circuit board 40. The display apparatus 1 may further include various other elements, for example, an integrated circuit chip 30.

The display panel 10 includes a display area DA and a peripheral area PA. The display area DA is a portion of the display panel 10 where an image is displayed, and the peripheral area PA at least partially surrounds the display area DA and is a portion of the display panel 10 where circuits and/or signal lines for generating and/or transmitting various signals to the display area DA are located. The peripheral area PA may surround the display area DA. In FIG. 1, a boundary between the display area DA and the peripheral area PA is indicated by a dashed line.

Pixels PX may be located in the display area DA of the display panel 10. In the display area DA, signal lines such as a first scan line 121, a second scan line 122, a data line 171, a driving voltage line 172, a common voltage line 173, and/or an initialization voltage line 174 may be located. The first scan line 121 and the second scan line 122 may extend substantially in a first direction (x direction of FIG. 1). The data line 171, the driving voltage line 172, the common voltage line 173, and the initialization voltage line 174 may extend substantially in a second direction (y direction of FIG. 1). The second direction may intersect the first direction. However, the disclosure is not limited thereto. For example, at least one of the driving voltage line 172, the common voltage line 173, and the initialization voltage line 174 may include a portion extending substantially in the first direction (x direction of FIG. 1) and a portion extending substantially in the second direction (y direction of FIG. 1) to have a mesh shape.

Each of the pixels PX may be connected to the first scan line 121, the second scan line 122, the data line 171, the driving voltage line 172, the common voltage line 173, and/or the initialization voltage line 174, to receive a first scan signal, a second scan signal, a data voltage, a driving voltage, a common voltage, and/or a driving voltage from the signal lines 122, 171, 172, 173, and 174. The pixel PX may include a light-emitting element such as a light-emitting diode.

Touch electrodes may be located in the display area DA of the display panel 10 to detect a touch of a touch input device, such as a stylus, or a user's body part, such as a finger or the like.

In the peripheral area PA of the display panel 10, a connector CP may be located, and the connector CP may be where connection wirings for transmitting external signals to wirings of the display panel 10 are located. In an embodiment of the present invention, the connector CP may be at a portion of the display panel 10 that is adjacent to an edge of the display panel 10; however, the present invention is not limited thereto, and the connector CP may be positioned at another portion of the display panel 10.

A first end portion of the flexible circuit board 20 may be connected to the connector CP. Accordingly, wirings of the flexible circuit board 20 may be electrically connected to the wirings of the display panel 10 through the connection wirings. Although one flexible circuit board 20 may be provided as shown in FIG. 1, in an embodiment of the present invention, a plurality of flexible circuit boards 20 may be provided in the first direction (x direction of FIG. 1). The following will be described assuming that one flexible circuit board 20 is provided as shown in FIG. 1.

The printed circuit board 40 may be connected to the flexible circuit board 20. For example, an output pad unit OP may be spaced apart from an edge (e.g., away from a side in a +y direction of FIG. 1) of the printed circuit board 40; however, the present invention is not limited thereto. A second end portion of the flexible circuit board 20 that is opposite to the first end portion of the flexible circuit board 20 may be connected to the output pad unit OP of the printed circuit board 40. Accordingly, the wirings of the flexible circuit board 20 may be electrically connected to output pads of the printed circuit board 40.

A driving unit for generating and/or processing various signals for driving the display panel 10 may be located in the peripheral area PA of the display panel 10. The driving unit may include a data driver for applying a data signal to the data line 171, a gate driver for applying a gate signal to the first scan line 121 and the second scan line 122, and a signal controller for controlling the data driver and the gate driver. A data signal or the like may be applied to the pixels PX at a certain timing according to a scan signal generated by the gate driver.

The gate driver may be integrated in the display panel 10, and may be located on at least a side of the display area DA. The data driver may be provided as an integrated circuit chip 30. The integrated circuit chip 30 may be mounted on the flexible circuit board 20 or the printed circuit board 40. The following will be described assuming that the integrated circuit chip 30 is mounted on the printed circuit board 40. Signals output from the integrated circuit chip 30 may be transmitted from the printed circuit board 40 through the wirings of the flexible circuit board 20 connected to the connection wirings to the wirings of the display panel 10 also connected to the connection wirings.

The display apparatus may include a plurality of integrated circuit chips 30, and the plurality of integrated circuit chips 30 may be mounted on the printed circuit board 40. In addition, the integrated circuit chip 30 may be mounted in the peripheral area PA of the display panel 10. In this case, for example, the integrated circuit chip 30 may be located between the connector CP and the display area DA.

As described above, the integrated circuit chip 30 may output signals that are applied to the display area DA. For example, the integrated circuit chip 30 may output a data voltage, a driving voltage, a common voltage, and/or an initialization voltage. A data voltage transmission line, a driving voltage transmission line, a common voltage transmission line, and/or an initialization voltage transmission line may be located in the peripheral area PA. The data voltage transmission line, the driving voltage transmission line, the common voltage transmission line, and/or the initialization voltage transmission line may respectively transmit a data voltage, a driving voltage, a common voltage, and/or an initialization voltage, which are output from the integrated circuit chip 30, to the data line 171, the driving voltage line 172, the common voltage line 173, and/or the initialization voltage line 174 of the display area DAL The integrated circuit chip 30 may also output signals for controlling the gate driver.

The integrated circuit chip 30 may receive, from the printed circuit board 40, signals (e.g., image data and a signal or power related to the image data) based on which the above signals are generated. For example, the printed circuit board 40 may transmit a signal or power of a controller to the integrated circuit chip 30, and the integrated circuit chip 30 may transmit a signal through wirings of the printed circuit board 40 and through the flexible circuit board 20 to the wirings of the display panel 10.

In addition, a processor and/or memory 50 may be located on the printed circuit board 40. For example, when the display apparatus is applied to a mobile communication terminal, the processor 50 may be an application processor including a central processing unit, a graphics processing unit and/or a modem.

Figure 2:
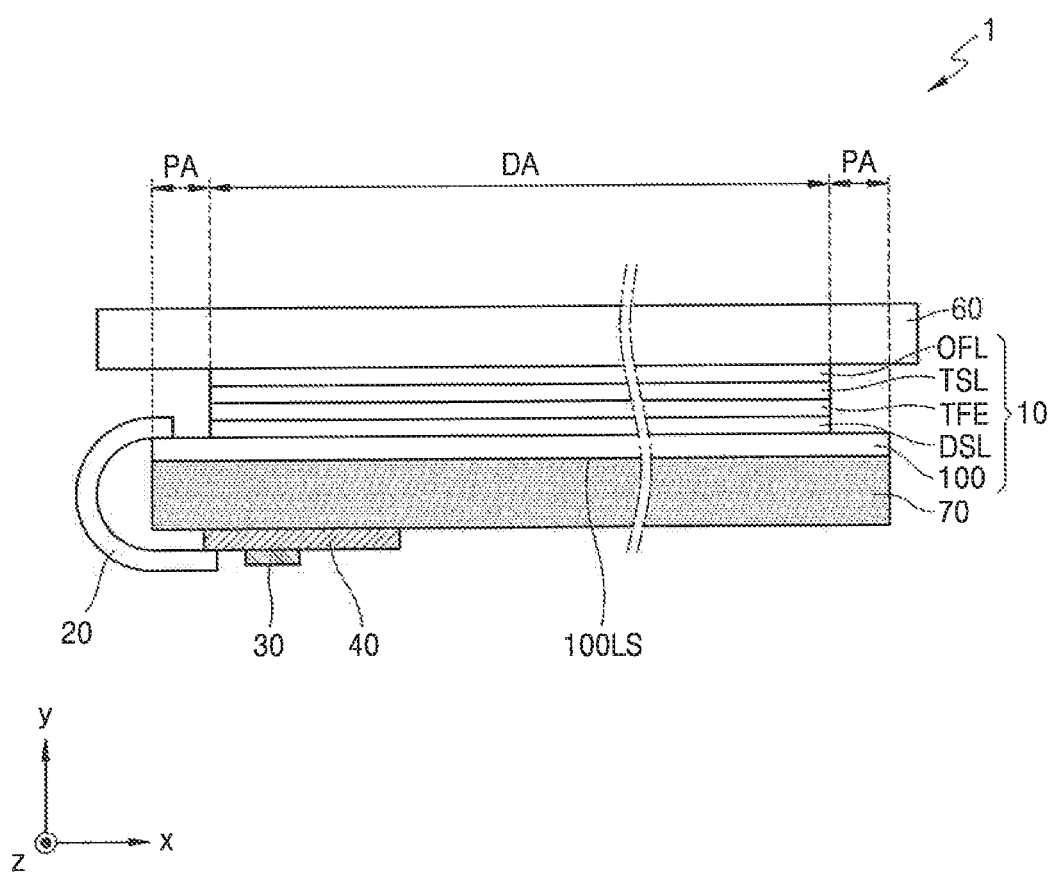
FIG. 2 is a side view schematically illustrating a display apparatus including elements of FIG. 1 of the present invention.

FIG. 2 is a side view schematically illustrating a display apparatus including elements of FIG. 1.

Referring to FIG. 2, the display apparatus 1 may include the display panel 10, the flexible circuit board 20, the integrated circuit chip 30, the printed circuit board 40, and a cover window 60. FIG. 2 is a cross-sectional view illustrating a display apparatus in which the flexible circuit board 20 is bent in FIG. 1, when viewed from a side.

The display panel 10 may include a display element. For example, the display panel 10 may be an organic light-emitting display panel using an organic light-emitting diode, a micro light-emitting diode (LED) display panel using a micro LED, a quantum dot light-emitting display panel using a quantum dot light-emitting diode, or an inorganic light-emitting display panel using an inorganic light-emitting device including an inorganic semiconductor. In addition, the display panel 10 may be a non-light-emitting display panel such as a liquid crystal display (LCD) panel, an electrophoretic display (EPD) panel, or an electro-wetting display (EWD) panel. When the display panel 10 is a non-light-emitting display panel, the display apparatus 1 may include a backlight unit that supplies light to the display panel 10. The following will be described assuming that the display panel 10 is an organic light-emitting display panel using an organic light-emitting diode as a display element.

The display panel 10 may include a substrate 100, and multiple layers located on the substrate 100. In an embodiment of the present invention, the display panel 10 may include the substrate 100, and a display layer DSL, a thin-film encapsulation layer TFE, a touch sensor layer TSL, and an optical functional layer OFL.

The substrate 100 may include a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. In an embodiment of the present invention, the substrate 100 may have a multi-layer structure including a base layer including the polymer resin and a barrier layer. The substrate 100 including the polymer resin may be flexible, reliable, or bendable.

The display layer DSL may be located on the substrate 100. The display layer DSL may include pixel circuits and display elements. In this case, the pixel circuits may be respectively connected to the display elements. The pixel circuit may include a thin-film transistor and a storage capacitor. Accordingly, the display layer DSL may include a plurality of display elements, a plurality of thin-film transistors, and storage capacitors. In addition, the display layer DSL may further include insulating layers located between the display elements, the thin-film transistors, and the storage capacitors.

The thin-film encapsulation layer TFE may be located on the display layer DSL. The thin-film encapsulation layer TFE may be located on the display element to cover the display element. In an embodiment of the present invention, the thin-film encapsulation layer TFT may include at least one inorganic encapsulation layer and at least one organic encapsulation layer. The at least one inorganic encapsulation layer may include at least one inorganic material such as aluminum oxide ($Al_2O_3$), titanium oxide ($TiO_2$), tantalum oxide ($Ta_2O_5$), zinc oxide ($ZnO_x$), silicon oxide ($SiO_2$), silicon nitride ($SiN_x$), and silicon oxynitride (SiON). The at least one organic encapsulation layer may include a polymer-based material. Examples of the polymer-based material may include an acrylic resin, an epoxy resin, polyimide, and polyethylene. In an embodiment of the present invention, the at least one organic encapsulation layer may include acrylate.

The touch sensor layer TSL may be located on the thin-film encapsulation layer TFE. The touch sensor layer TSL may sense coordinate information according to an external input, for example, a touch event. The touch sensor layer TSL may include a sensor electrode and touch wirings connected to the sensor electrode. The touch sensor layer TSL may detect an external input by using a self-capacitive method or a mutual capacitive method.

The touch sensor layer TSL may be formed on the thin-film encapsulation layer TFE. In addition, the touch sensor layer TSL may be separately formed on a touch substrate, and then may be coupled to the thin-film encapsulation layer TFE through an adhesive layer such as an optically clear adhesive. In an embodiment of the present invention, the touch sensor layer TSL may be formed directly on the thin-film encapsulation layer TFE, and in this case, an adhesive layer might not be located between the touch sensor layer TSL and the thin-film encapsulation layer TFE.

The optical functional layer OFL may be located on the touch sensor layer TSL. The optical functional layer OFL may reduce a reflectance of light (e.g., external light) incident on the display apparatus 1, and/or increase color purity of light emitted from the display apparatus 1. In an embodiment of the present invention, the optical functional layer OFL may include a phase retarder and a polarizer. The phase retarder may be, for example, a film type phase retarder or a liquid crystal coating type phase retarder, and may include a $\lambda/2$ phase retarder and/or a $\lambda/4$ phase retarder. The polarizer may also be a film type polarizer or a liquid crystal coating type polarizer. For example, the film type polarizer may include a stretchable synthetic resin film, and the liquid crystal coating type polarizer may include liquid crystals arranged in a certain arrangement. The phase retarder and the polarizer may further include a protective film.

In an embodiment of the present invention, the optical functional layer OFL may include a black matrix and color filters. The color filters may be arranged in consideration of a color of light emitted by each of pixels of the display apparatus 1. Each of the color filters may include a red, green, or blue pigment or dye. In addition, each of the color filters may further include quantum dots in addition to the pigment or dye. In addition, some of the color filters might not include the pigment or dye, and may include scattering particles such as titanium oxide.

In an embodiment of the present invention, the optical functional layer OFL may include a destructive interference structure. The destructive interference structure may include a first reflective layer and a second reflective layer that are located on different layers from each other. First reflected light and second reflected light respectively reflected by the first reflective layer and the second reflective layer may be destructively interfered with each other, thereby reducing a reflectance of external light.

The cover window 60 may be located on the display panel 10. The cover window 60 may protect the display panel 10. In an embodiment of the present invention, the cover window 60 may be a flexible window. The cover window 60 may protect the display panel 10 by being easily bent by an external force without causing cracks or the like. The cover window 60 may include at least one of glass, sapphire, and/or plastic. The cover window 60 may include, for example, ultra-thin glass (UTG) or colorless polyimide (CPI). In an embodiment of the present invention, the cover window 60 may have a structure in which a flexible polymer layer is located on a surface of a glass substrate, or may include only a polymer layer.

For example, the cover window 60 may be attached to the display panel 10 by using an adhesive member. The adhesive member may be a transparent adhesive member such as an optically clear adhesive (OCA) film. The adhesive member may include any of various other known adhesive materials. The adhesive member may be formed on the top of the display panel 10 by using any of various methods. For example, the adhesive member may be formed as a film and may be attached to the top surface of the display panel 10 (e.g., the top of the thin-film encapsulation layer), or may be formed as a material and may be applied to the top of the display panel 10.

A cover panel 70 may be located on the bottom surface of the display panel 10. The cover panel 70 may absorb external impact and may prevent damage to the display panel 10.

The cover panel 70 may include a polymer resin such as polyurethane, polycarbonate, polypropylene, or polyethylene, or may include an elastic material such as a sponge which is provided by foaming a rubber, a urethane-based material, or an acrylic material. In addition, the cover panel 70 may further include a metal material such as copper. That is, for example, the cover panel 70 may include a first layer, which is formed of a polymer resin or an elastic material, and a second layer, which is formed of a metal material located under the first layer.

The flexible circuit board 20 may be bent toward a bottom surface of the cover panel 70. For example, the flexible circuit board 20 may surround a side of the cover panel 70 and may be located so that ends of the flexible circuit board 20 face each other with the cover panel 70 therebetween. Accordingly, the printed circuit board 40 connected to the flexible circuit board 20 may also be located on the bottom surface of the cover panel 70.

Figure 3:
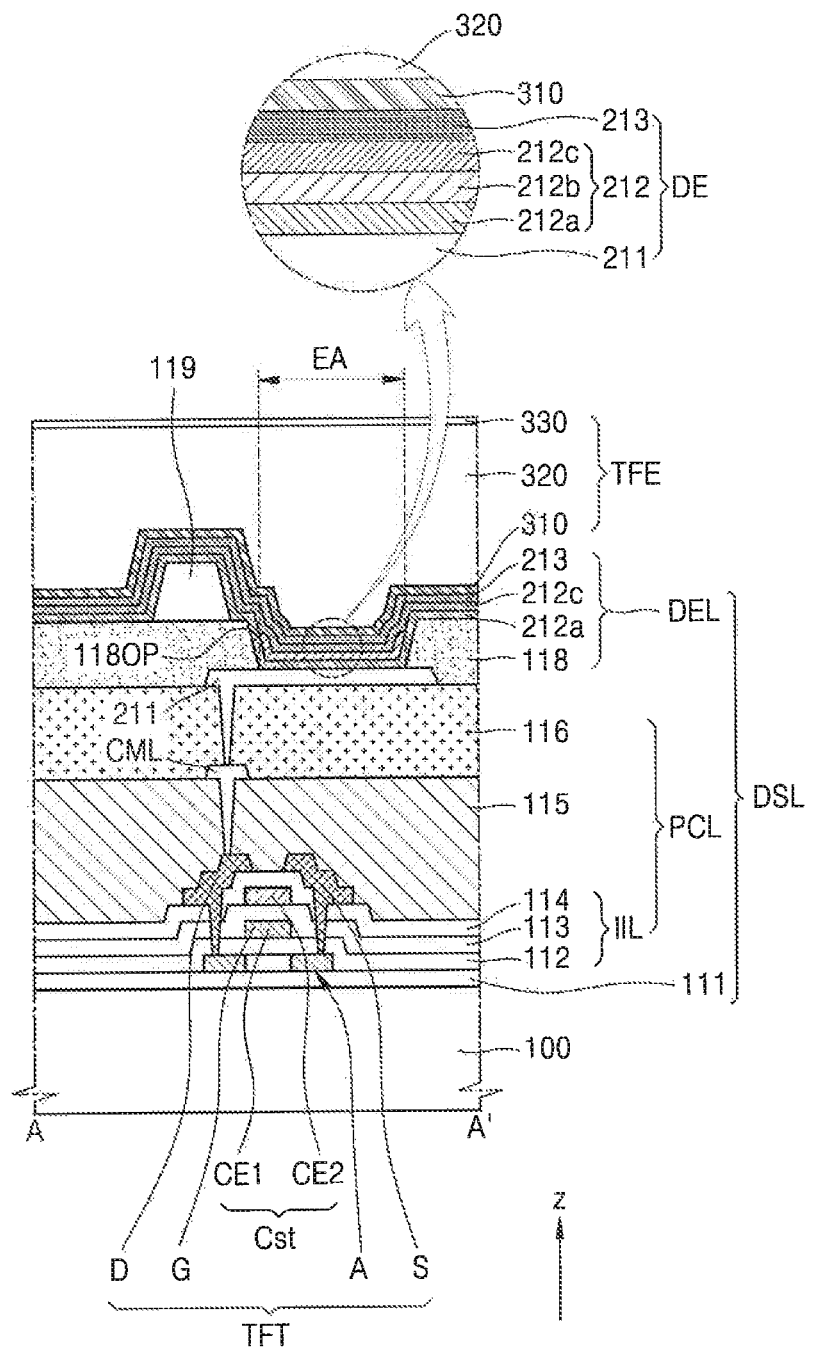
FIG. 3 is a cross-sectional view schematically illustrating a display panel taken along line A-A' of FIG. 1 of the present invention.

FIG. 3 is a cross-sectional view schematically illustrating a display panel taken along line A-A' of FIG. 1.

Referring to FIG. 3, the display panel 10 may include the substrate 100, the display layer DSL, the thin-film encapsulation layer TFE, the touch sensor layer TSL (see FIG. 2), and the optical functional layer OFL (see FIG. 2). The display layer DSL will be mainly described.

The display layer DSL may be located in the display area DA. The display layer DSL may include a buffer layer 111, a pixel circuit layer PCL, and a display element layer DEL.

The buffer layer 111 may be located on the substrate 100. The buffer layer 111 may include, for example, an inorganic insulating material such as silicon nitride, silicon oxynitride, or silicon oxide, and may have a single or multi-layer structure including the above inorganic insulating material.

The pixel circuit layer PCL may be located on the buffer layer 111. The pixel circuit layer PCL may include a thin-film transistor TFT included in a pixel circuit, and an inorganic insulating layer IIL, a first planarization layer 115, and a second planarization layer 116 located under and/or over elements of the thin-film transistor TFT. The inorganic insulating layer IIL may include a first gate insulating layer 112, a second gate insulating layer 113, and an interlayer insulating layer 114.

The thin-film transistor TFT may include a semiconductor layer A, and the semiconductor layer A may include polysilicon. In addition, the semiconductor layer A may include, for example, amorphous silicon, an oxide semiconductor, or an organic semiconductor. The semiconductor layer A may include a channel region, and a drain region and a source region located on both sides of the channel region. A gate electrode G may overlap the channel region.

The gate electrode G may include a low-resistance metal material. The gate electrode G may include a conductive material including, for example, molybdenum (Mo), aluminum (Al), copper (Cu), or titanium (Ti), and may have a single or multi-layer structure including the above material.

The first gate insulating layer 112 between the semiconductor layer A and the gate electrode G may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$). In this case, zinc oxide ($ZnO_x$) may be zinc oxide (ZnO) and/or zinc peroxide ($ZnO_2$).

The second gate insulating layer 113 may cover the gate electrode G. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO), like the first gate insulating layer 112. In this case, zinc oxide ($ZnO_x$) may be zinc oxide (ZnO) and/or zinc peroxide ($ZnO_2$).

An upper electrode CE2 of a storage capacitor Cst may be located on the second gate insulating layer 113. The upper electrode CE2 may overlap the gate electrode G that is located below the upper electrode CE2. In this case, the gate electrode G and the upper electrode CE2 overlapping each other with the second gate insulating layer 113 therebetween may constitute the storage capacitor Cst of the pixel circuit. For example, the gate electrode G may function as a lower electrode CE1 of the storage capacitor Cst. As such, the storage capacitor Cst and the thin-film transistor TFT may overlap each other. In an embodiment of the present invention, the storage capacitor Cst might not overlap the thin-film transistor TFT.

The upper electrode CE2 may include, for example, aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material.

The interlayer insulating layer 114 may cover the upper electrode CE2. The interlayer insulating layer 114 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$). In this case, zinc oxide ($ZnO_x$) may be zinc oxide (ZnO) and/or zinc peroxide ($ZnO_2$). The interlayer insulating layer 114 may have a single or multi-layer structure including the above inorganic insulating material.

Each of a drain electrode D and a source electrode S may be located on the interlayer insulating layer 114. Each of the drain electrode D and the source electrode S may include a material having a relatively high conductivity. Each of the drain electrode D and the source electrode S may include a conductive material including, for example, molybdenum (Mo), aluminum (Al), copper (Cu), or titanium (Ti), and may have a single or multi-layer structure including the above material. In an embodiment of the present invention, each of the drain electrode D and the source electrode S may have a multi-layer structure including Ti/Al/Ti.

The first planarization layer 115 may cover the drain electrode D and the source electrode S. The first planarization layer 115 may include an organic insulating layer. The first planarization layer 115 may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

A connection electrode CML may be located on the first planarization layer 115. In this case, the connection electrode CML may be connected to the drain electrode D or the source electrode S through a contact hole formed in the first planarization layer 115. The connection electrode CML may include a material having a relatively high conductivity. The connection electrode CML may include a conductive material including, for example, molybdenum (Mo), aluminum (Al), copper (Cu), or titanium (Ti), and may have a single or multi-layer structure including the above material. In an embodiment of the present invention, the connection electrode CML may have a multi-layer structure including Ti/Al/Ti.

The second planarization layer 116 may cover the connection electrode CML. The second planarization layer 116 may include an organic insulating layer. The second planarization layer 116 may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The display element layer DEL may be located on the pixel circuit layer PCL. The display element layer DEL may include a display element DE. The display element DE may be an organic light-emitting diode OLED. A pixel electrode 211 of the display element DE may be electrically connected to the connection electrode CML through a contact hole formed in the second planarization layer 116.

The pixel electrode 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment of the present invention, the pixel electrode 211 may include a reflective film including, for example, silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment of the present invention, the pixel electrode 211 may further include a film formed of ITO, IZO, ZnO, or $In_2O_3$ over/under the reflective film.

A pixel-defining film 118 may have an opening 118OP through which a portion of the pixel electrode 211 is exposed and may be located on the pixel electrode 211. The pixel-defining film 118 may include an organic insulating material and/or an inorganic insulating material. The opening 118OP may define an emission area EA of light emitted by the display element DE. For example, a width of the opening 118OP may correspond to a width of the emission area EA of the display element DE.

A spacer 119 may be located on the pixel-defining film 118. The spacer 119 may be used to prevent damage to the substrate 100 in a method of manufacturing a display apparatus. A mask sheet may be used to manufacture a display panel, and in this case, when the mask sheet is introduced into the opening 118OP of the pixel-defining film 118 or is closely attached to the pixel-defining film 118 to deposit a deposition material on the substrate 100, the spacer 119 may prevent a part of the substrate 100 from being damaged by the mask sheet.

The spacer 119 may include an organic insulating material such as polyimide. In addition, the spacer 119 may include an inorganic insulating material such as silicon nitride or silicon oxide, or may include an organic insulating material and an inorganic insulating material.

In an embodiment of the present invention, the spacer 119 may include a material different from that of the pixel-defining film 118. In an embodiment of the present invention, the spacer 119 may include the same material as that of the pixel-defining film 118, and in this case, the pixel-defining film 118 and the spacer 119 may be formed together in a mask process using a halftone mask or the like.

The intermediate layer 212 may be located on the pixel-defining film 118. The intermediate layer 212 may include an emission layer 212b located in the opening 118OP of the pixel-defining film 118. The emission layer 212b may include a relatively high molecular weight organic material or a relatively low molecular weight organic material that emits light of a certain color.

A first functional layer 212a and a second functional layer 212c may be respectively located under and over the emission layer 212b. The first functional layer 212a may include, for example, a hole transport layer (HTL), or may include an HTL and a hole injection layer (HIL). The second functional layer 212c that is located over the emission layer 212b may be optional. The second functional layer 212c may include an electron transport layer (ETL) and/or an electron injection layer (EIL). For example, the first functional layer 212a and/or the second functional layer 212c may be a common layer entirely covering the substrate 100, like a counter electrode 213 described below. However, the present invention is not limited thereto.

The counter electrode 213 may be formed of a conductive material having a low work function. For example, the counter electrode 213 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In addition, the counter electrode 213 may further include a layer formed of, for example, ITO, IZO, ZnO, or $In_2O_3$ on the (semi)transparent layer including the above material.

In an embodiment of the present invention, a capping layer may be further located on the counter electrode 213. The capping layer may include, for example, LiF, an inorganic material, and/or an organic material.

The thin-film encapsulation layer TFE may be located on the counter electrode 213. In an embodiment of the present invention, the thin-film encapsulation layer TFE may include at least one inorganic encapsulation layer and at least one organic encapsulation layer. In FIG. 3, the thin-film encapsulation layer TFE includes a first inorganic encapsulation layer 310, an organic encapsulation layer 320, and a second inorganic encapsulation layer 330 that are sequentially stacked on the display element layer DEL.

Each of the first and second inorganic encapsulation layers 310 and 330 may include at least one inorganic material from among, for example, aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acrylic resin, an epoxy resin, polyimide, and polyethylene. In an embodiment of the present invention, the organic encapsulation layer 320 may include acrylate.

As described above, the touch sensor layer TSL may be located on the thin-film encapsulation layer TFE, and the optical functional layer OFL may be located on the touch sensor layer TSL.

Figure 4:
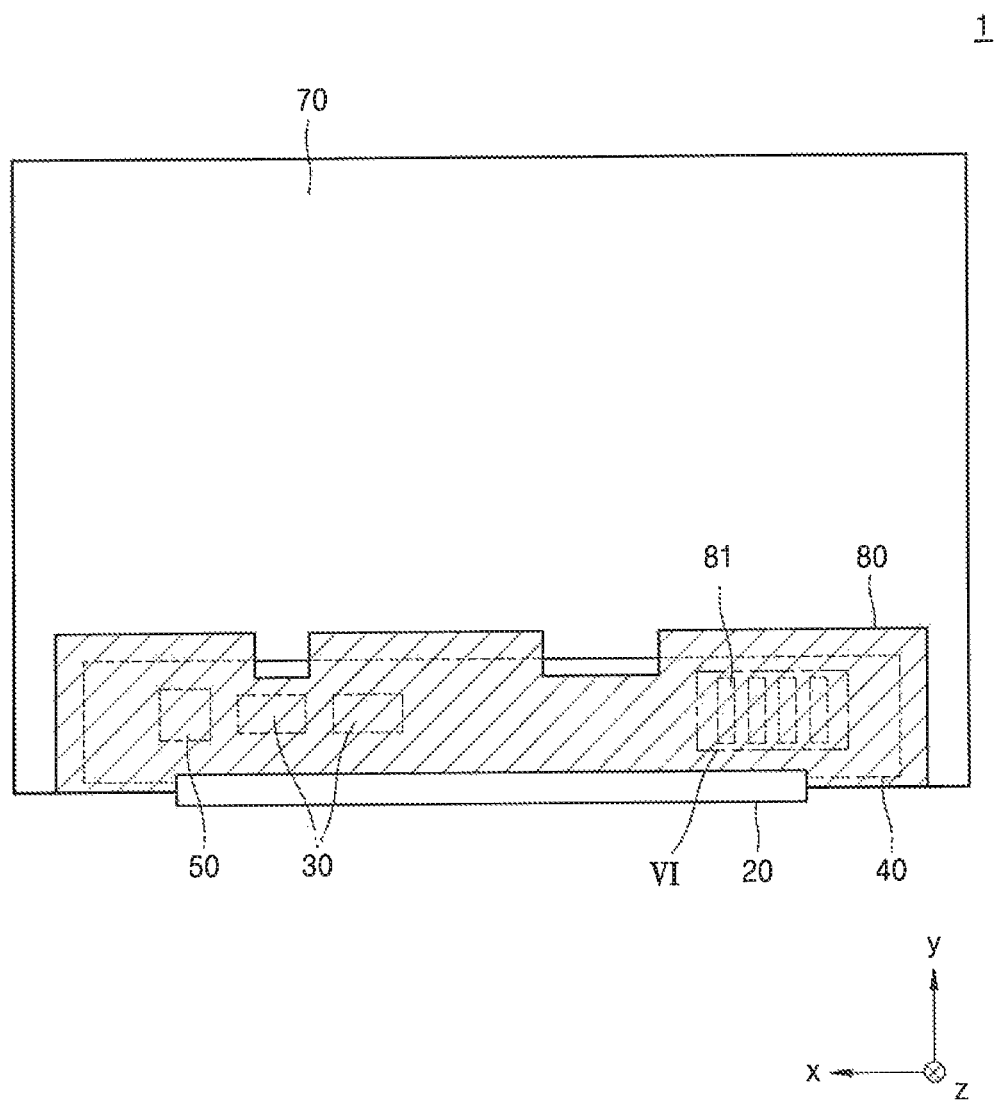
FIG. 4 is a bottom view schematically illustrating a display apparatus, according to an embodiment of the present invention.

FIG. 4 is a bottom view schematically illustrating a display apparatus, according to an embodiment of the present invention. In detail, FIG. 4 illustrates a surface of the display apparatus 1 opposite to a surface of FIG. 1, and illustrates a state where the flexible circuit substrate 20 is bent as shown in FIG. 2.

Referring to FIG. 4, as described above, the flexible circuit board 20 may be bent, and thus, the printed circuit board 40 may be located on a surface of the cover panel 70 (e.g., surface in a −z direction of FIG. 4) that is opposite to a surface of the cover panel 70 on which the substrate 100 is located. In an embodiment of the present invention, an adhesive layer may be located between the printed circuit board 40 and the cover panel 70 to fix the printed circuit board 40 to the cover panel 70.

A cover portion 80 may be located on the printed circuit board 40. For example, the cover portion 80 may be larger than the printed circuit board 40 to cover the printed circuit board 40. Accordingly, in a plan view (e.g., when viewed in a direction perpendicular to a surface of the substrate 100), the cover portion 80 may overlap the printed circuit board 40. In an embodiment of the present invention, the cover portion 80 may include an insulating material, and may cover and protect the printed circuit board 40. In addition, the cover portion 80 may insulate the printed circuit board 40 from the outside. In addition, the cover portion 80 may shield electromagnetic waves emitted from the printed circuit board 40. The cover portion 80 may include at least one of, for example, an insulating tape, an insulating mesh, and an insulating film coated with an insulating material. The following will be described assuming that the cover portion 80 includes an insulating tape.

An inner surface of the cover portion 80, that is, a surface of the cover portion 80 facing the cover panel 70, may include an adhesive material. Accordingly, the cover portion 80 may be fixed by being adhered to the printed circuit board 40 and the cover panel 70 to cover the printed circuit board 40.

Figure 5:
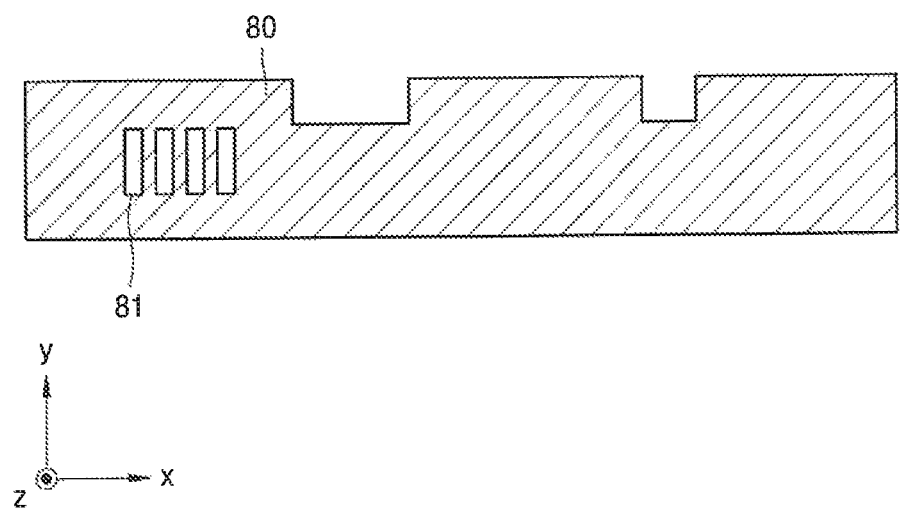
FIG. 5 is a view illustrating an inner surface of a cover portion, according to an embodiment of the present invention.
Figure 6A:
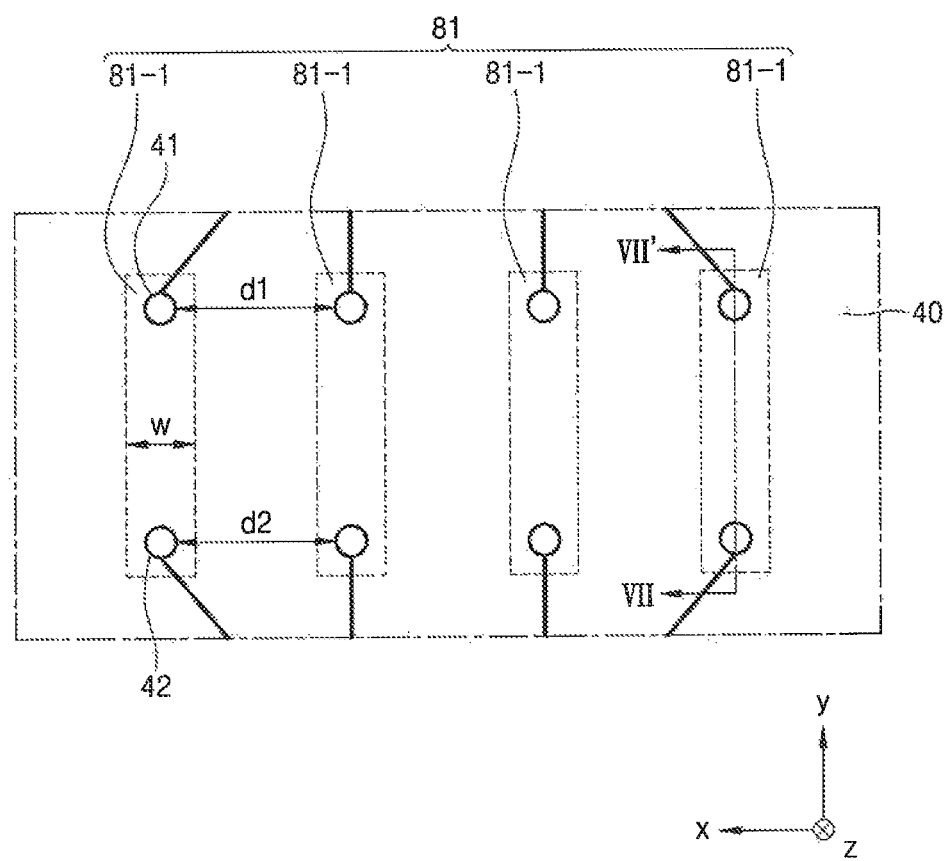
FIG. 6A is an enlarged view illustrating a portion VI of FIG. 4.
Figure 6B:
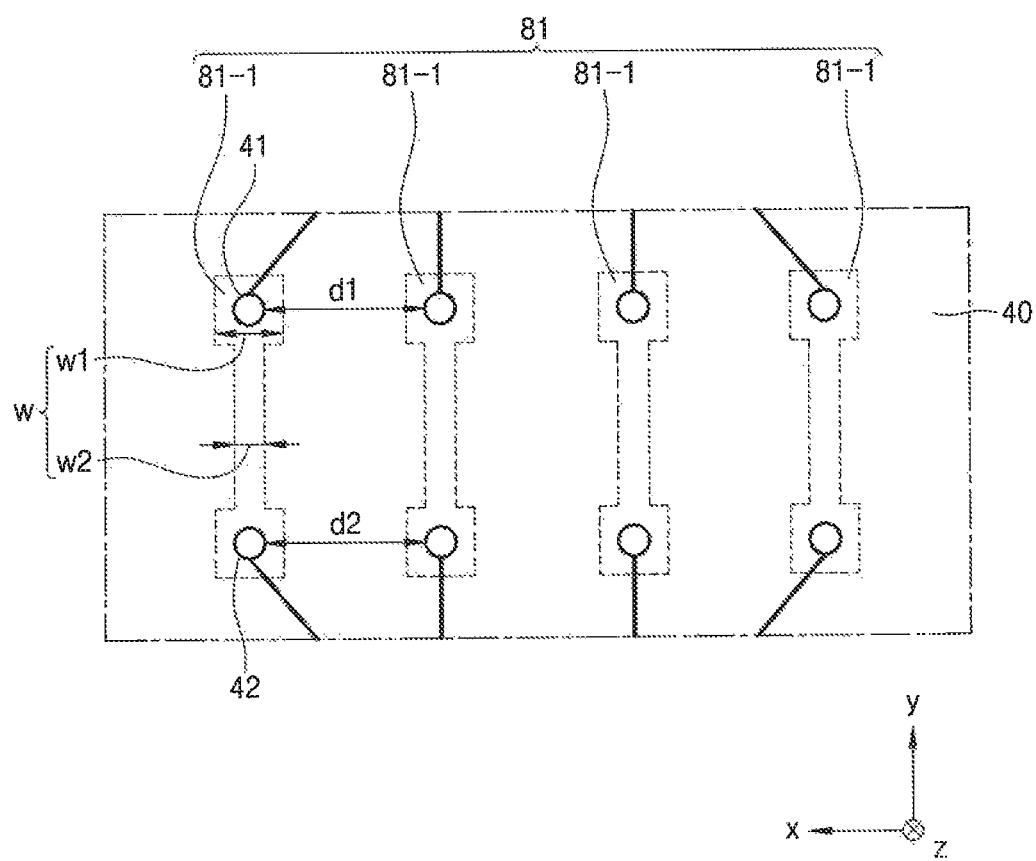
FIG. 6B is a view similar to FIG. 6A, illustrating a connection pattern, according to an embodiment of the present invention.

FIG. 5 is a view illustrating an inner surface of a cover portion, according to an embodiment of the present invention. FIG. 6A is an enlarged view illustrating a portion VI of FIG. 4. FIG. 6B is a view similar to FIG. 6A, illustrating a connection pattern, according to an embodiment of the present invention. In addition, FIG. 5 illustrates a surface of the cover portion 80 facing the cover panel 70. In FIGS. 6A and 6B, the cover portion 80 is indicated by a dashed line for convenience of explanation.

Referring to FIGS. 5 and 6A and 6B, a connection pattern 81 may be located on an inner surface of the cover portion 80, that is, a surface facing the cover panel 70 (see FIG. 4). In an embodiment of the present invention, the connection pattern 81 may include a conductive material such as copper or aluminum. In addition, the connection pattern 81 may be provided as a film. Because the cover portion 80 includes an adhesive material on the inner surface, the connection pattern 81 that is a film may be attached to the inner surface of the cover portion 80 in a simple manner. The connection pattern 81 may connect to terminals of the printed circuit board 40 described below.

Referring to FIG. 6A, a first terminal 41 may be located on a side of the printed circuit board 40, for example, a first side in a +y direction of FIG. 6A (e.g., an upper side). The first terminals 41 may be connected to first wirings of the printed circuit board 40 extending to the side of the printed circuit board 40 (e.g., +y direction of FIG. 6A). For example, the first wirings may extend in the +y direction. The first wirings may be connected to a controller or the like. For example, a signal or power transmitted from the controller or the like may be transmitted to the first terminal 41 through the first wiring.

A second terminal 42 may be located on a second side (e.g., side in a −y direction of FIG. 6A) opposite to the first side of the printed circuit board 40. The second terminals 42 may be connected to second wirings of the printed circuit board 40 extending to the second side of the printed circuit board 40 (e.g., −y direction of FIG. 6A). The second wirings may be connected to the output pad unit OP (see FIG. 1). For example, a signal or power transmitted from the second terminal 42 may be transmitted to the flexible circuit board 20 through the output pad unit OP and may be transmitted to wirings of the substrate 100.

A plurality of first terminals 41 may be arranged in a first direction (x direction of FIG. 6A), and a plurality of second terminals 42 may also be arranged in the first direction (x direction of FIG. 6A). The plurality of first terminals 41 may be spaced apart from one another, for example, in the first direction (x direction of FIG. 6A). In this case, the plurality of first terminals 41 may have an interval d1 in the first direction. The plurality of second terminals 42 may be spaced apart from one another in the first direction to have an interval d2. In an embodiment of the present invention, the interval d1 between the plurality of first terminals 41 and the interval d2 between the plurality of second terminals 42 may be substantially the same. In an embodiment of the present invention, the interval d1 between the plurality of first terminals 41 and the interval d2 between the plurality of second terminals 42 may be different from each other, but the following will be described assuming that the interval d1 between the plurality of first terminals 41 and the interval d2 between the plurality of second terminals 42 are the same.

The number of second terminals 42 may be equal to the number of the first terminals 41. In addition, the first terminal 41 may face a corresponding second terminal 42 and may be spaced apart from the corresponding second terminal 42 in a second direction (y direction of FIG. 6A). In an embodiment of the present invention, the first terminal 41 and the second terminal 42 may be spaced apart from each other in a direction inclined by a certain angle with respect to the second direction. For example, a virtual line connecting the first terminal 41 to the second terminal 42 may be a straight line inclined at a certain angle with respect to the second direction.

In addition, in an embodiment of the present invention, the plurality of first terminals 41 may be spaced apart from one another in the second direction (y direction of FIG. 6A), and may have the interval d1 in the second direction. The plurality of second terminals 42 may be spaced apart from one another in the second direction, and may have the interval d2 in the second direction. In this case, the first terminal 41 and the second terminal 42 corresponding to the first terminal 41 may face each other and may be spaced apart from each other in the first direction (x direction of FIG. 6A). In addition, the present invention is not limited to an arrangement of the plurality of first terminals 41 and the plurality of second terminals 42 as described above, and the plurality of first terminals 41 and the plurality of second terminals 42 may be arranged in various ways, for example, in a zigzag pattern.

For convenience of explanation, the following will be described assuming that the plurality of first terminals 41 are spaced apart from one another in the first direction, the plurality of second terminals 42 are spaced apart from one another in the first direction, and the plurality of first terminals 41 and the plurality of second terminals 42 are spaced apart from each other in the second direction to face each other.

When the cover portion 80 is attached to the printed circuit board 40, the connection pattern 81 may connect the first terminal 41 to the second terminal 42. Accordingly, when viewed in a plan view, the connection pattern 81 may be arranged within a perimeter of the printed circuit board 40. The connection pattern 81 may connect the first terminal 41 to the second terminal 42 for electric connection. Accordingly, the connection pattern 81 may include as many linear patterns 81-1 as pairs of first terminals 41 and second terminals 42. The linear patterns 81-1 may be parallel to one another, and an interval between the linear patterns 81-1 may correspond to the interval d1 between the first terminals 41 and/or the interval d2 between the second terminals 42.

In addition, a length of the linear pattern 81-1 may be substantially the same as a distance between the first terminal 41 and the second terminal 42. In addition, by considering a tolerance when the cover portion 80 is attached to the printed circuit board 40, a length of the linear pattern 81-1 may be greater than a distance between the first terminal 41 and the second terminal 42. Accordingly, contact between the linear pattern 81-1 and the first and second terminals 41 and 42 may be increased.

As such, as the connection pattern 81 provided on the inner surface of the cover portion 80 connects the first terminal 41 to the second terminal 42 for electric connection, the connection pattern 81 may connect terminals of the printed circuit board 40 to each other in a relatively simple manner. According to a comparative example, a space between the first terminal 41 and the second terminal 42 may be an area where, for example, a 0 ohm resistor is located and connected or a bead is located and connected. For example, according to the comparative example, because a 0 ohm resistor or a bead is mounted and connected to simply connect terminals spaced apart from one another on the printed circuit board 40, component costs may be incurred. According to an embodiment of the present invention, however, because the connection pattern 81 is formed on the inner surface of the cover portion 80 when the cover portion 80 for protecting the printed circuit board 40 and for shielding electromagnetic waves is attached, terminals may be connected in a relatively simple manner. Accordingly, a 0 ohm resistor or a bead does not need to be mounted, and thus, component costs may be saved and reduced.

In addition, in an embodiment of the present invention, a width w of each linear pattern 81-1 may be less than the interval d1 between the first terminals 41 and/or the interval d2 between the second terminals 42. By considering a tolerance when the cover portion 80 is attached to the printed circuit board 40, a short circuit occurring when the connection pattern 81 connects other terminals to each other without connecting desired terminals to each other may be prevented.

In an embodiment of the present invention, the width w of each linear pattern 81-1 may be large enough to completely cover the first terminal 41 and the second terminal 42. For example, the width of the linear pattern 81-1 may be greater than a diameter of the first terminal 41 and a diameter of the second terminal 42.

In addition, referring to FIG. 6B, in an embodiment of the present invention, the width w of each linear pattern 81-1 may include a width w1, which is at the first terminal 41 and the second terminal 42, and a width w2, which is between the first terminal 41 and the second terminal 42, and the width w1 may be different from the width w2. For example, the width w1 at the first terminal 41 and the second terminal 42 may be greater than the width w2 between the first terminal 41 and the second terminal 42. By considering a tolerance when the cover portion 80 is attached to the printed circuit board 40, contact of the linear pattern 81-1 on the terminals may be maintained. Accordingly, a contact area between terminals and the linear pattern 81-1 may be secured and an increase in contact resistance may be prevented.

Figure 7:
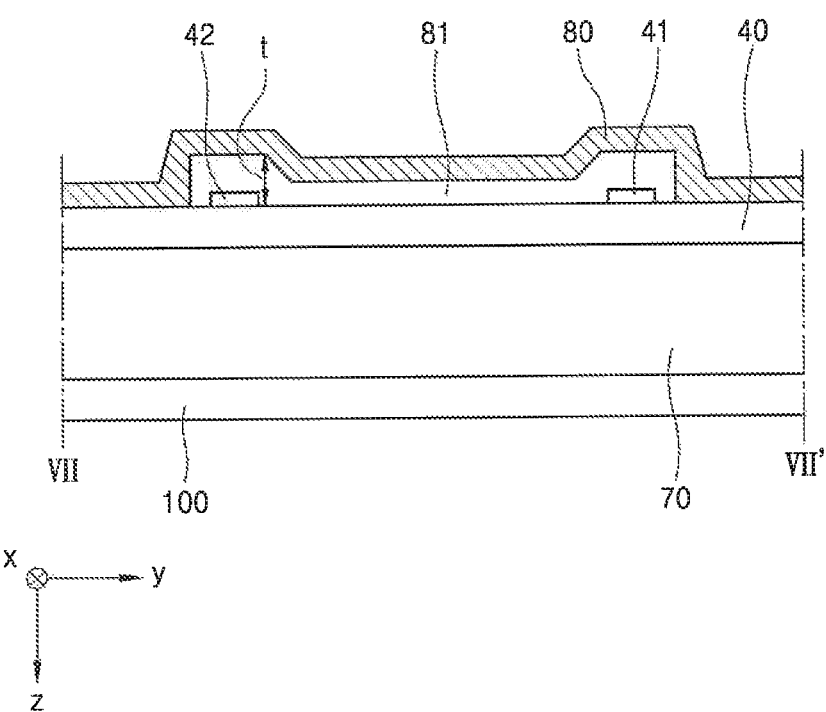
FIG. 7 is a cross-sectional view illustrating a printed circuit board taken along line VII-VII' of FIG. 6A.

FIG. 7 is a cross-sectional view illustrating the printed circuit board 40 taken along line VII-VII' of FIG. 6A.

Referring to FIG. 7, in an embodiment of the present invention, a thickness t of the connection pattern 81 might not be constant. For example, regarding the thickness t of the connection pattern 81, a thickness of portions of the connection pattern 81 at the first terminal 41 and the second terminal 42 may be greater than a thickness of a portion of the connection pattern 81 between the first terminal 41 and the second terminal 42. Because the connection pattern 81 is pressed toward the printed circuit board 40 when the cover portion 80 is attached to the printed circuit board 40, contact resistance at the first terminal 41 and the second terminal 42 may be improved. However, the present embodiment is an example, and the present invention is not limited thereto. For example, the thickness t of the connection pattern 81 may be substantially constant.

A process of manufacturing the display apparatus 1 will be described briefly. As described above, the flexible circuit board 20 may be bent so that the printed circuit board 40 faces the cover panel 70, and the printed circuit board 40 may be adhered to a surface of the cover panel 70, for example, by using an adhesive member.

Next, the cover portion 80 may be prepared. In this case, the connection pattern 81 may be located on an inner surface of the cover portion 80, that is, a surface facing the printed circuit board 40. The connection pattern 81 may include a conductive material in an embodiment of the present invention. For example, the connection pattern 81 may be formed as a conductive film and may be attached to the inner surface of the cover portion 80. In this case, because the inner surface of the cover portion 80 is coated with an adhesive material, the connection pattern 81 may be easily attached. In addition, in this case, the connection pattern 81 may be located to connect the first terminal 41 to the second terminal 42 when the cover portion 80 is attached to the printed circuit board 40.

Accordingly, the cover portion 80 may be attached to the printed circuit board 40 to protect the printed circuit board 740 and to block electromagnetic waves. In addition, the cover portion 80 may be attached to the printed circuit board 40 to connect terminals in a simple manner through the connection pattern 81 provided on the inner surface of the cover portion 80. Accordingly, a 0 ohm resistor or a bead might not need to be mounted and component costs may be saved and reduced.

According to an embodiment of the present invention, a display apparatus capable of connecting terminals without mounting an additional component (e.g., a 0 ohm resistor or a bead), and a method of manufacturing the display apparatus may be provided.

In addition, accordingly, component costs may be saved in manufacturing the display apparatus.

The effects of the present invention are not limited to the above-mentioned effects, and other effects not mentioned herein will be clearly understood by one of ordinary skill in the art.

While the present invention has been described with reference to exemplary embodiments thereof, it will be understood by those of ordinary skill in the art that various changes in form and details may be made thereto without departing from the spirit and scope of the present invention.

What is claimed is:

1. A display apparatus comprising:
a substrate;
a display layer located on a first surface of the substrate;
a cover panel located on a second surface, opposite to the first surface, of the substrate;
a printed circuit board located on the cover panel;

a plurality of first terminals located on a first side of the printed circuit board;

a plurality of second terminals spaced apart from the plurality of first terminals;

a cover portion covering the printed circuit board; and a connection pattern located on a surface of the cover portion and arranged within a perimeter of the printed circuit board, wherein the surface of the cover portion faces the printed circuit board.

2. The display apparatus of claim 1, wherein the connection pattern connects the plurality of first terminals to the plurality of second terminals.

3. The display apparatus of claim 2, wherein the connection pattern comprises a plurality of linear patterns spaced apart from one another and parallel to one another, wherein each of the plurality of linear patterns connects a first-first terminal of the plurality of first terminals to a first-second terminal of the plurality of second terminals facing the first-first terminal.

4. The display apparatus of claim 3, wherein a width of each of the plurality of linear patterns is large enough such that each of the plurality of linear patterns completely covers the first terminal and the second terminal.

5. The display apparatus of claim 3, wherein a width of each of the plurality of linear patterns is less than each of an interval between the plurality of first terminals and an interval between the plurality of second terminals.

6. The display apparatus of claim 3, wherein a length of each of the plurality of linear patterns is greater than a distance between the first-first terminal and the first-second terminal.

7. The display apparatus of claim 2, wherein a thickness of portions of the connection pattern at a first-first terminal of the plurality of first terminals and at a first-second terminal of the plurality of second terminals is greater than a thickness of a portion of the connection pattern between the first-first terminal and the first-second terminal.

8. The display apparatus of claim 1, wherein the cover portion comprises an insulating material, and the connection pattern comprises a conductive material.

9. The display apparatus of claim 8, wherein the connection pattern is provided as a film comprising at least one of copper or aluminum.

10. The display apparatus of claim 1, wherein an adhesive layer is located between the cover portion and the connection pattern.

11. A method of manufacturing a display apparatus, the method comprising:

bending a flexible circuit board connected to a substrate to face a rear surface of the substrate;

providing a printed circuit board on a cover panel that is located on the rear surface of the substrate, wherein the printed circuit board is connected to the flexible circuit board;

forming a connection pattern on a cover portion, wherein the connection pattern connects a plurality of terminals spaced apart from one another on the printed circuit board to each other when the cover portion is attached to the printed circuit board; and providing the cover portion on the printed circuit board.

12. The method of claim 11, wherein the connection pattern connects a plurality of first terminals of the plurality of terminals located on a first side of the printed circuit board to a plurality of second terminals of the plurality of terminals, wherein the plurality of second terminals is spaced apart from the plurality of first terminals.

13. The method of claim 12, wherein the connection pattern comprises a plurality of linear patterns that are spaced apart from one another and are parallel to one another.

14. The method of claim 13, wherein the forming of the connection pattern on the cover portion comprises forming the connection pattern so that a width of each of the plurality of linear patterns is less than each of an interval between the plurality of first terminals and an interval between the plurality of second terminals.

15. The method of claim 13, wherein the forming of the connection pattern on the cover portion comprises forming the connection pattern so that a length of each of the plurality of linear patterns is greater than a distance between a first terminal of the plurality of first terminals and a second terminal of the plurality of second terminals.

16. The method of claim 13, wherein the forming of the connection pattern on the cover portion comprises forming the connection pattern so that a thickness of portions of the connection pattern at a first terminal of the plurality of first terminals and at a second terminal of the plurality of first terminals is greater than a thickness of a portion of the connection pattern between the first terminal and the second terminal.

17. The method of claim 11, wherein the forming of the connection pattern on the cover portion comprises adhering the connection pattern to a surface of the cover portion facing the printed circuit board.

18. The method of claim 11, wherein the cover portion comprises an insulating material, and the connection pattern comprises a conductive material.

19. The method of claim 18, wherein the connection pattern is provided as a film comprising at least one of copper or aluminum.

20. The method of claim 11, wherein the providing of the cover portion on the printed circuit board comprises forming an adhesive layer on a surface of the cover portion facing the printed circuit board and adhering the cover portion to the printed circuit board.

* * * * *